(12) United States Patent
Okubo et al.

(10) Patent No.: US 11,933,291 B2
(45) Date of Patent: Mar. 19, 2024

(54) COMPRESSOR, MONITORING SYSTEM, AND METHOD OF MONITORING COMPRESSOR

(71) Applicant: Hitachi Industrial Equipment Systems Co., Ltd., Tokyo (JP)

(72) Inventors: Tomofumi Okubo, Tokyo (JP); Norinaga Suzuki, Tokyo (JP); Kiyomi Tashima, Tokyo (JP); Akihiro Takanuki, Tokyo (JP)

(73) Assignee: Hitachi Industrial Equipment Systems Co., Ltd., Tokyo (JP)

( * ) Notice: Subject to any disclaimer, the term of this patent is extended or adjusted under 35 U.S.C. 154(b) by 230 days.

(21) Appl. No.: 17/628,466

(22) PCT Filed: Jul. 28, 2020

(86) PCT No.: PCT/JP2020/028943
§ 371 (c)(1),
(2) Date: Jan. 19, 2022

(87) PCT Pub. No.: WO2021/084821
PCT Pub. Date: May 6, 2021

(65) Prior Publication Data
US 2022/0260075 A1  Aug. 18, 2022

(30) Foreign Application Priority Data
Oct. 31, 2019  (JP) ................................ 2019-198222

(51) Int. Cl.
*F04B 49/10* (2006.01)
*F04B 49/02* (2006.01)
(Continued)

(52) U.S. Cl.
CPC .............. *F04B 49/10* (2013.01); *F04B 49/02* (2013.01); *F04B 49/065* (2013.01); *F04B 51/00* (2013.01);
(Continued)

(58) Field of Classification Search
CPC ........ F04B 40/10; F04B 40/02; F04B 40/065; F04B 51/00; F04C 18/16; F04C 28/28;
(Continued)

(56) References Cited

U.S. PATENT DOCUMENTS 7,826,985 B2 * 11/2010 Weiss ...................... H02P 27/00
702/42
9,529,038 B2 * 12/2016 Lipp .................. G01R 31/2642
(Continued)

FOREIGN PATENT DOCUMENTS

JP        9-126138 A     5/1997
JP     2006-166569 A     6/2006
(Continued)

OTHER PUBLICATIONS

International Preliminary Report on Patentability (PCT/IB/338 & PCT/IB/373) issued in PCT Application No. PCT/JP2020/028943 dated May 12, 2022, including English translation of document C2 (Japanese-language Written Opinion (PCT/ISA/237), filed on Jan. 19, 2022) (six (6) pages).
(Continued)

*Primary Examiner* — Charles G Freay
(74) *Attorney, Agent, or Firm* — Crowell & Moring LLP

(57) ABSTRACT

A compressor, a monitoring system and a method of monitoring a compressor that make it possible to monitor the remaining lifetime of a semiconductor element of a motor control system while the processing load is reduced are provided. A compressor (1) includes: a motor control system (10) that controls the rotation speed of a motor (2); a
(Continued)

compressor body (3) that compresses air by being driven by the motor (2); a pressure sensor (20) that is provided on the discharge side of the compressor body (3); and a running controller (11) that performs switching between load running and no-load running on the basis of the pressure sensed by the pressure sensor (20). A motor controller (26) of the motor control system (10) calculates a relative temperature of a semiconductor element relative to a reference temperature by using a temperature of the semiconductor element sensed by a temperature sensor (27) at the time of switching from no-load running to load running, and calculates an amount of change in a remaining lifetime of the semiconductor element corresponding to the relative temperature of the semiconductor element, whereby monitoring the remaining lifetime of the semiconductor element.

15 Claims, 6 Drawing Sheets

(51) Int. Cl.
*F04B 49/06* (2006.01)
*F04B 51/00* (2006.01)
*F04C 28/28* (2006.01)
*G01R 31/26* (2020.01)
*G05B 23/02* (2006.01)
*F04C 18/16* (2006.01)
*H02P 29/02* (2016.01)

(52) U.S. Cl.
CPC .......... *F04C 28/28* (2013.01); *G01R 31/2642* (2013.01); *G05B 23/0283* (2013.01); *F04C 18/16* (2013.01); *F04C 2240/40* (2013.01); *F04C 2240/808* (2013.01); *F04C 2270/025* (2013.01); *F04C 2270/16* (2013.01); *F04C 2270/18* (2013.01); *F04C 2270/19* (2013.01); *F04C 2270/80* (2013.01); *H02P 29/02* (2013.01)

(58) Field of Classification Search
CPC ............ F04C 2240/40; F04C 2240/808; F04C 2270/025; F04C 2270/26; F04C 2270/28; F04C 2270/29; F04C 2270/80; G01R 31/2642; G05B 23/0283; H02P 29/02
See application file for complete search history.

(56) References Cited

U.S. PATENT DOCUMENTS

| 10,379,070 B2 * | 8/2019 | Ishikawa ................ G01N 25/72 |
| 2005/0071090 A1 | 3/2005 | Katou |
| 2011/0015881 A1 | 1/2011 | Chen et al. |
| 2020/0240415 A1 | 7/2020 | Kotani |

FOREIGN PATENT DOCUMENTS

| JP | 2010-31874 A | 2/2010 |
| JP | 2013-212000 A | 10/2013 |
| JP | 2016-47001 A | 4/2016 |
| JP | 2018-87576 A | 6/2018 |
| JP | 2018-115869 A | 7/2018 |
| WO | WO 2004/082114 A1 | 9/2004 |
| WO | WO 2019/049415 A1 | 3/2019 |

OTHER PUBLICATIONS

International Search Report (PCT/ISA/210) issued in PCT Application No. PCT/JP2020/028943 dated Sep. 8, 2020 with English translation (seven (7) pages).

Japanese-language Written Opinion (PCT/ISA/237) issued in PCT Application No. PCT/JP2020/028943 dated Sep. 8, 2020 (four (4) pages).

Extended European Search Report issued in European Application No. 20882833.5 dated Nov. 17, 2023 (8 pages).

* cited by examiner

COMPRESSOR, MONITORING SYSTEM, AND METHOD OF MONITORING COMPRESSOR

TECHNICAL FIELD

The present invention relates to a compressor, a monitoring system, and a method of monitoring a compressor.

BACKGROUND ART

Industrial machines such as compressors are apparatuses that are often used when objects are produced at factories and the like. There is a typical need regarding industrial machines, and users want to be kept informed of the state of an apparatus or the like daily such that the production line does not have to be stopped emergently. With respect to a method of monitoring such industrial equipment, for example, there is a technology like Patent Document 1.

A motor control system of Patent Document 1 calculates an output current from a current flowing through a semiconductor element of a power module (switching circuit), calculates a temperature change amplitude by estimating a temperature change in the semiconductor element on the basis of the output current or the like, and calculates the number of power cycles corresponding to the temperature change amplitude, whereby monitoring the remaining lifetime of the semiconductor element.

PRIOR ART DOCUMENT

Patent Document

Patent Document 1: WO 2004/082114

SUMMARY OF THE INVENTION

Problem to be Solved by the Invention

However, in Patent Document 1, the remaining lifetime is monitored by estimating the temperature change in the semiconductor element on the basis of the output current or the like, and calculating various values such as the magnitude of the temperature change or the number of power cycles, and the amount of calculation is large. In addition, since calculations are performed multiple times by using the estimated values, there is a fear that errors of the estimated lifetime increase.

Furthermore, since different methods of motor control are required for a case where it is driven as a motor, and for a case where an entire apparatus is controlled by using a motor as motive power, and the timings of occurrence of temperature changes in semiconductor elements vary, the technology of Patent Document 1 cannot be applied to all types of industrial equipment that use motors.

The present invention has been made in view of the matters described above, and there is a demand for a technology that provides a monitoring method suited for operation of an industrial machine that uses a motor as motive power, while the precision of remaining lifetime monitoring is enhanced.

Means for Solving the Problem

In order to solve the problem described above, the configuration described in claims is applied. The present invention includes a plurality of means for solving the problem described above, and an example thereof is a compressor including: a motor; a motor control system that controls a rotation speed of the motor; a compressor body that compresses a gas by being driven by the motor; a pressure sensor that is provided on a discharge side of the compressor body, and senses a pressure of the compressed gas; and a running controller that performs switching between load running and no-load running on the basis of the pressure sensed by the pressure sensor, the motor control system having: a motor controller that controls power to be supplied to the motor via a circuit having a semiconductor element; and a temperature sensor that senses a temperature of the semiconductor element, in which at least one of the motor controller and the running controller is configured to: calculate a relative temperature of the semiconductor element relative to a reference temperature by using the temperature sensed by the temperature sensor at time of switching from no-load running to load running; and calculate an amount of change in a remaining lifetime of the semiconductor element corresponding to the relative temperature of the semiconductor element, whereby monitoring the remaining lifetime of the semiconductor element.

Advantages of the Invention

According to the present invention, the remaining lifetime of a semiconductor element of a motor control system can be monitored while the processing load is reduced.

Note that problems, configurations, and advantages other than those described above are made clear by the following explanation.

MODES FOR CARRYING OUT THE INVENTION

One embodiment to which the present invention is applied is explained with reference to the figures. In examples to be explained, the present invention is applied to an oil-supply type screw compressor as a compressor.

Figure 1:
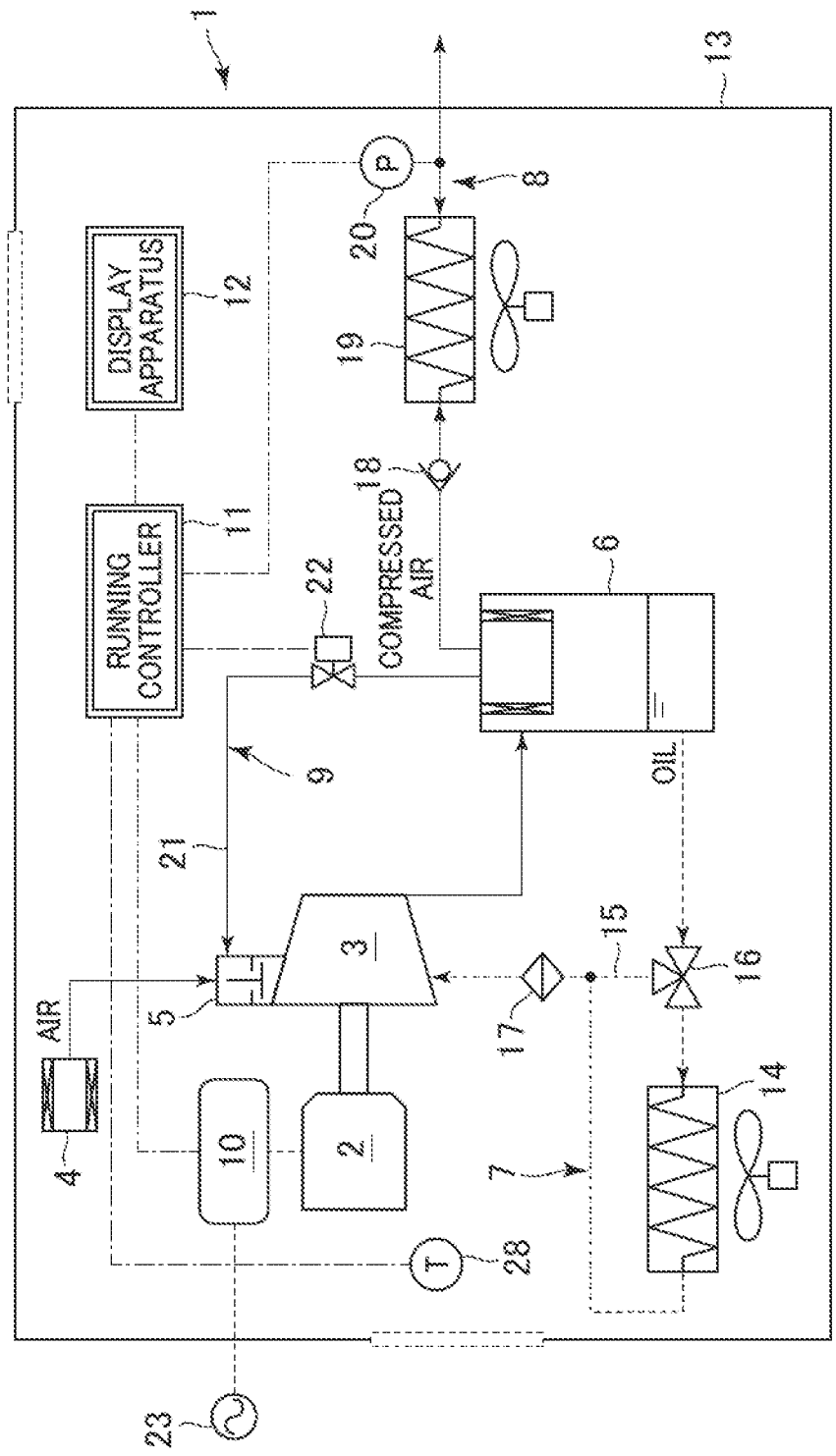
FIG. 1 is a schematic diagram representing the configuration of a compressor according to one embodiment to which the present invention is applied.
Figure 2:
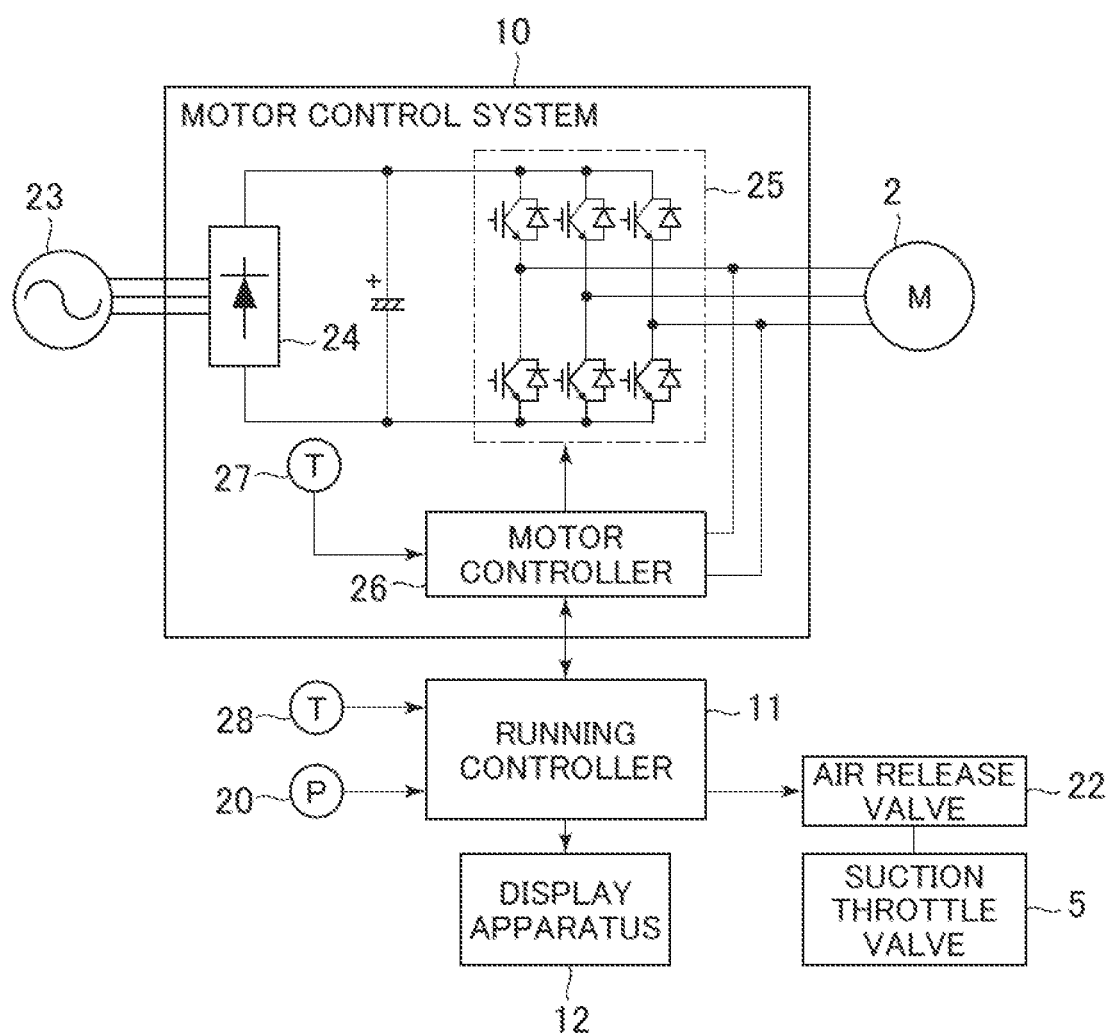
FIG. 2 is a schematic diagram representing, along with related equipment, the configuration of a motor control system according to the one embodiment to which the present invention is applied.

FIG. 1 is a schematic diagram representing the configuration of a compressor in the present embodiment. FIG. 2 is a schematic diagram representing, along with related equipment, the configuration of a motor control system in the present embodiment.

A compressor 1 according to the present embodiment includes: a motor 2; a compressor body 3 that compresses air by being driven by the motor 2; an air filter 4 and a suction throttle valve 5 that are provided on the intake side of the compressor body 3; a separator 6 that is provided on the discharge side of the compressor body 3; and an oil supply line 7, a compressed air supply line 8 and an air release line 9 that are connected to the separator 6. In addition, the compressor 1 includes a motor control system 10 that controls the rotation speed of the motor 2, a running controller 11, and a display apparatus 12. Note that the compressor 1 according to the present embodiment is a package-shaped compressor unit housing the equipment mentioned before in a housing 13.

Although not depicted, for example, the compressor body 3 includes a pair of male and female screw rotors that mesh with each other, and a casing that houses the screw rotors. A plurality of compression chambers formed in the tooth spaces of the screw rotors. When the screw rotors rotate, the compression chambers move in the axial direction of the rotors (from left to right in FIG. 1). The compression chambers take in and compress air (gas), and discharge compressed air (compressed gas). For purposes such as cooling of compression heat, lubrication of the rotors, or sealing of the compression chambers, for example, the compressor body 3 is configured to inject oil (liquid) to the compression chambers immediately after the start of the compression.

The separator 6 separates the compressed air discharged from the compressor body 3 and oil included in the compressed air, and stores the separated oil at a lower section thereof. The oil stored at the separator 6 is supplied to the compression chambers via the oil supply line 7 due to a pressure difference between the separator 6 and the compression chambers of the compressor body 3. The oil supply line 7 has: an oil cooler 14 that cools oil; a bypass path 15 that bypasses the oil cooler 14; a temperature regulating valve (three-way valve) 16 provided at a branch section that branches into a path on the side of the oil cooler 14 and a path on the side of the bypass path 15; and an oil filter 17 provided downstream of a merging section at which the path on the side of the oil cooler 14 and the path on the side of the bypass path 15 merge. The temperature regulating valve 16 is configured to adjust the ratio of a flow rate on the side of the oil cooler 14 and a flow rate on the side of the bypass path 15, according to the temperature of oil having flowed into the temperature regulating valve 16, and thereby adjust the temperature of oil to be supplied to the compression chambers of the compressor body 3.

The compressed air separated by the separator 6 is supplied via the compressed air supply line 8 to a location which is outside the unit and where the compressed air is used. The compressed air supply line 8 has: a pressure regulating valve (check valve) 18; an air cooler 19 that is provided downstream of the pressure regulating valve 18 and cools the compressed air; and a pressure sensor 20 that is provided downstream of the pressure regulating valve 18 (the pressure sensor 20 is provided downstream of the air cooler 19 in the present embodiment, but may be provided upstream of the air cooler 19), and senses the pressure of the compressed gas. Note that whereas the oil cooler 14 and the air cooler 19 according to the present embodiment are air-cooling type coolers (specifically, coolers that perform cooling by using cooling air generated by cooling fans), the oil cooler 14 and the air cooler 19 may be water-cooling type coolers (specifically, coolers that perform cooling by using a coolant supplied from the outside of the unit).

The air release line 9 has: an air release path 21 connected between the separator 6 and a primary side of the suction throttle valve 5 (specifically, the upstream side of the valve seat); an air release valve 22 (solenoid valve) provided on the air release path 21; and an operation path (not depicted) that is branched off on the downstream side of the air release valve 22 on the air release path 21, and is connected to an operation chamber (not depicted) of the suction throttle valve 5. When the air release valve 22 is closed, the air release line 9 does not release air from the separator 6 to the primary side of the suction throttle valve 5. At this time, the suction throttle valve 5 gets opened, since the pressure of the operation chamber of the suction throttle valve 5 lowers. Thereby, load running is started. On the other hand, when the air release valve 22 is opened, the air release line 9 releases air from the separator 6 to the primary side of the suction throttle valve 5. At this time, the suction throttle valve 5 gets closed, since the pressure of the operation chamber of the suction throttle valve 5 rises. Thereby, no-load running is started.

The running controller 11 performs control of switching driving and stopping of the motor 2, according to operation of a running switch (not depicted) or the like. Explaining specifically, when the running controller 11 receives an ON signal from the running switch as input, the running controller 11 outputs a command for driving the motor 2 to the motor control system 10, and causes the motor 2 to be driven. When the running controller 11 receives an OFF signal from the running switch as input, the running controller 11 outputs a command for stopping the motor 2 to the motor control system 10, and causes the motor 2 to be stopped.

In addition, on the basis of a pressure sensed by the pressure sensor 20, the running controller 11 performs control of switching between load running and no-load running by controlling the air release valve 22 and the suction throttle valve 5, and also switching between high-speed running and low-speed running by controlling the motor 2 via the motor control system 10 (details are mentioned below).

The motor control system 10 has: a diode module 24 (circuit) that converts an alternating current from a commercial power supply 23 to a direct current; a power module 25 (circuit) that converts the direct current obtained through the conversion at the diode module 24 into an alternating current, and controls the frequency of the alternating current to be output to the motor 2; and a motor controller 26 that controls the power module 25 according to a command from the running controller 11. Switching elements in the diode module 24 and the power module 25 include semiconductor elements. In addition, the motor control system 10 has a temperature sensor 27 that senses the temperature of another component positioned near the diode module 24 and the power module 25 as a representative temperature of the motor control system 10, for example. The inside of the housing 13 of the compressor 1 is provided with an air temperature sensor 28 that senses the air temperature around the motor control system 10 (i.e. around the circuits).

Note that the running controller 11 or the motor controller 26 has a calculation control section (e.g. a CPU) that executes calculation processes and control processes on the basis of a program, a storage section (e.g. a ROM and a RAM) that stores the program and results of the calculation processes, and the like.

Figure 3:
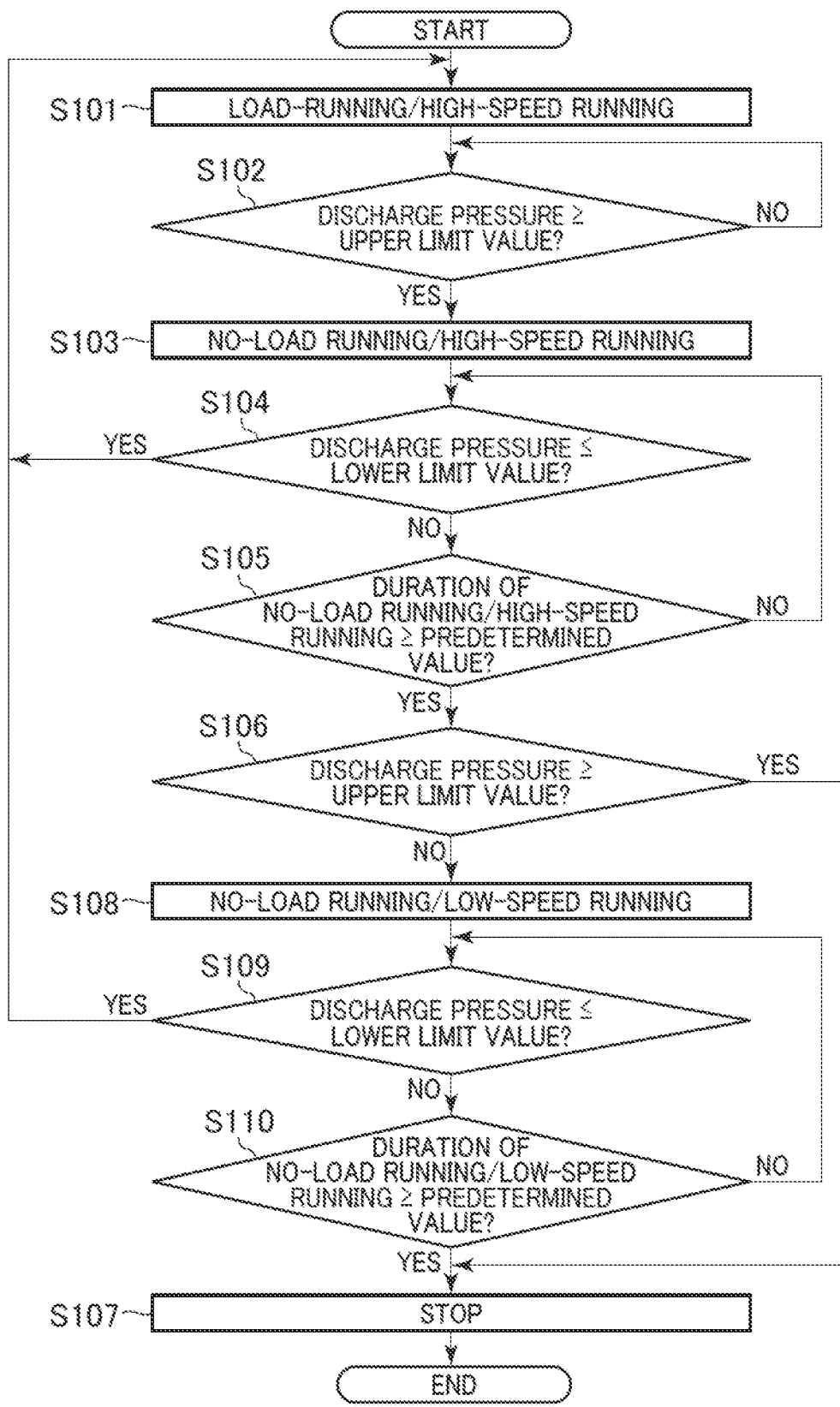
FIG. 3 is a flowchart representing a procedure of compressor running control according to the one embodiment to which the present invention is applied.

Next, details of compressor running control according to the present embodiment are explained. FIG. 3 is a flowchart representing a procedure of the compressor running control in the present embodiment.

When the running switch is switched from the OFF position to the ON position, the procedure proceeds to Step S101, and the running controller 11 causes load running and high-speed running to be performed. Explaining specifically, the running controller 11 performs control such that the air release valve 22 is closed, and thereby makes the suction throttle valve 5 opened, and causes load running to be performed. In addition, the running controller 11 outputs commands for driving and rotating the motor 2 to the motor controller 26. Accordingly, the motor controller 26 controls the power module 25 such that the rotation speed of the motor 2 becomes a preset first rotation speed (specifically, such that the frequency of an alternating current corresponding to the first rotation speed is attained).

The procedure proceeds to Step S102, and, during load running, the running controller 11 determines whether a pressure sensed by the pressure sensor 20 (hereinafter, referred to as a discharge pressure) is equal to or higher than a predetermined upper limit value. When the discharge pressure is lower than the predetermined upper limit value, the determination at Step S102 is repeated. When the discharge pressure is equal to or higher than the predetermined upper limit value, the procedure proceeds to Step S103. At Step S103, the running controller 11 performs switching from load running to no-load running. Explaining specifically, the running controller 11 performs control such that the air release valve 22 is opened, and thereby makes the suction throttle valve 5 closed, and performs switching to no-load running. In addition, high-speed running is continued. Since the air release valve 22 is opened, air is not compressed, and the motor 2 keeps rotation at a high speed without receiving torque (no-load state). If the motor is switched between a state where it is receiving a load, and a state where it is not receiving a load, the amount of current supplied to the motor changes significantly, and the temperatures of semiconductor elements in the motor control system change significantly.

The procedure proceeds to Step S104, and, during no-load running/high-speed running, the running controller 11 determines whether the discharge pressure is equal to or lower than a predetermined lower limit value. When the discharge pressure is equal to or lower than the predetermined lower limit value, the procedure returns to Step S101. That is, the running controller 11 performs switching from no-load running to load running.

When the discharge pressure exceeds the predetermined lower limit value during no-load running/high-speed running, the procedure proceeds to Step S105. At Step S105, the running controller 11 determines whether the duration of no-load running/high-speed running is equal to or longer than a predetermined value. Since the duration of no-load running/high-speed running is shorter than the predetermined value in the beginning, the procedure returns to Step S104. When the duration of no-load running/high-speed running has become equal to or longer than the predetermined value, the procedure proceeds to Step S106. At Step S106, the running controller 11 determines whether the discharge pressure is equal to or higher than the predetermined upper limit value. When the duration of no-load running/high-speed running has become equal to or longer than the predetermined value, and when the discharge pressure is equal to or higher than the predetermined upper limit value, the procedure proceeds to Step S107. At Step S107, the running controller 11 outputs a command for stopping the motor 2 to the motor controller 26, and causes the motor 2 to be stopped. Thereby, the compressor body 3 is stopped.

When the duration of no-load running/high-speed running has become equal to or longer than the predetermined value, and when the discharge pressure is lower than the predetermined upper limit value, the procedure proceeds to Step S108. At Step S108, the running controller 11 performs switching from high-speed running to low-speed running. Explaining specifically, the running controller 11 outputs a command for rotating the motor 2 to the motor controller 26. Accordingly, the motor controller 26 controls the power module 25 such that the rotation speed of the motor 2 becomes a second rotation speed which is preset lower than the first rotation speed (specifically, such that the frequency of an alternating current corresponding to the second rotation speed is attained). In addition, no-load running is continued.

The procedure proceeds to Step S109, and, during no-load running/low-speed running, the running controller 11 determines whether the discharge pressure is equal to or lower than the predetermined lower limit value. When the discharge pressure is equal to or lower than the predetermined lower limit value, the procedure returns to Step S101. That is, the running controller 11 performs switching from no-load running to load running.

When the discharge pressure exceeds the predetermined lower limit value during no-load running/low-speed running, the procedure proceeds to Step S110. At Step S110, the running controller 11 determines whether the duration of no-load running/low-speed running is equal to or longer than a predetermined value. Since the duration of no-load running/low-speed running is shorter than the predetermined value in the beginning, the procedure returns to Step S109. When the duration of no-load running/low-speed running has become equal to or longer than the predetermined value, the procedure proceeds to Step S107. That is, the running controller 11 causes the motor 2 and the compressor body 3 to be stopped.

Figure 4:
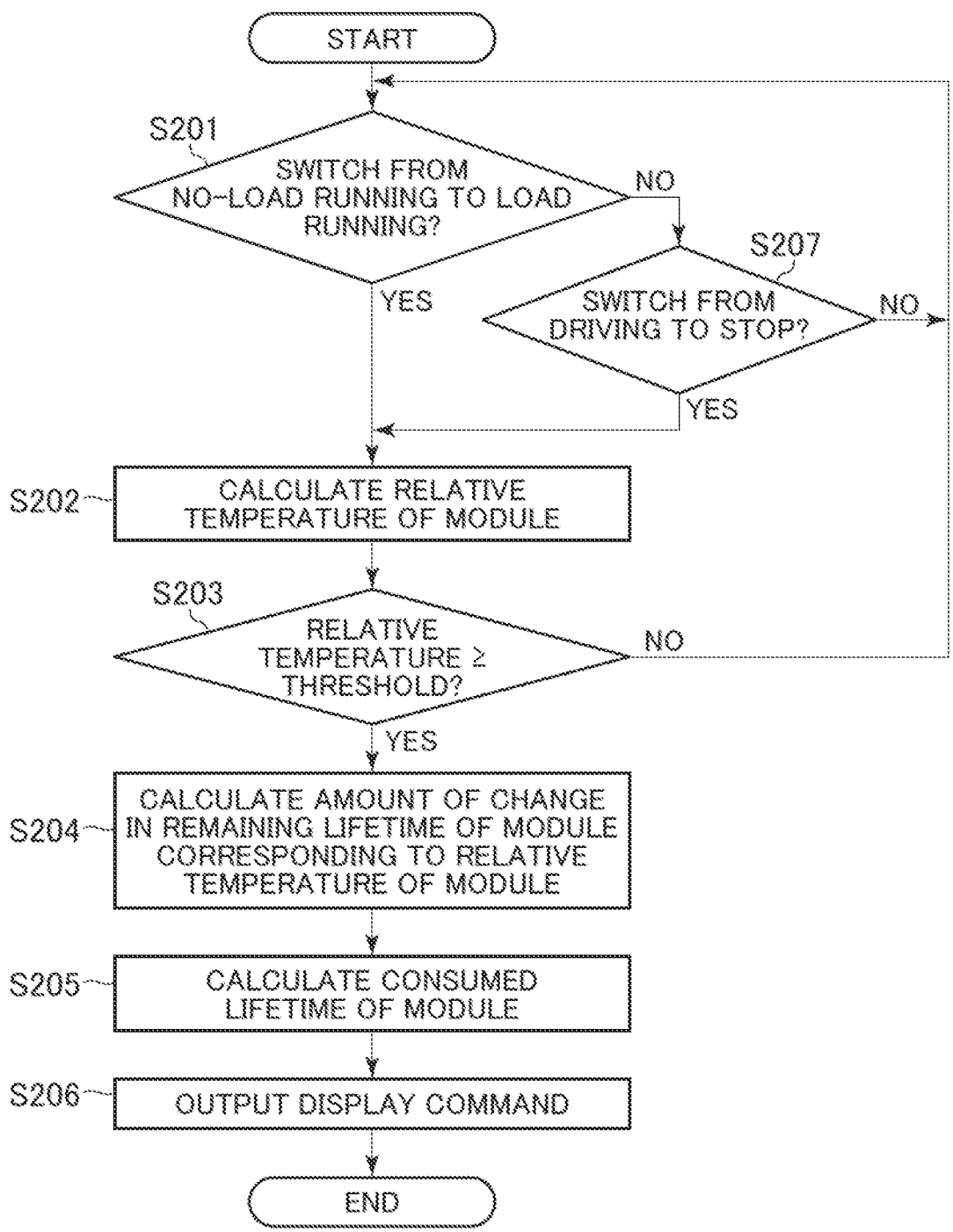
FIG. 4 is a flowchart representing a procedure of module monitoring control according to the one embodiment to which the present invention is applied.

The motor controller 26 controls the power module 25 according to the commands mentioned above from the running controller 11. In addition, the motor controller 26 receives, from the running controller 11, the running condition of the compressor, and sensing results of the air temperature sensor 28, and, on the basis of those types of information and sensing results of the temperature sensor 27, monitors the remaining lifetime of the diode module 24, and the remaining lifetime of the power module 25. Details of the module monitoring control are explained by using FIG. 4. FIG. 4 is a flowchart representing a procedure of the module monitoring control in the present embodiment.

At Step S201, the motor controller 26 determines whether there has been switching from no-load running to load running. When there has been switching from no-load running to load running, the motor controller 26 executes the following process.

At Step S202, at the time of switching from no-load running to load running, by using temperatures sensed by the temperature sensor 27 and the air temperature sensor 28 at the time of load running, and a relational expression about the temperature of the diode module 24 and the temperature of another component, the motor controller 26 calculates a relative temperature of the diode module 24 relative to a reference temperature sensed by the air temperature sensor 28 (i.e. the difference between the air temperature around the motor control system 10 and the temperature of the diode module 24). Similarly, at the time of switching from no-load running to load running, by using temperatures sensed by the temperature sensor 27 and the air temperature sensor 28 at the time of load running, and a relational expression about the temperature of the power module 25 and the temperature of another component, the motor controller 26 calculates a relative temperature of the power module 25 relative to the reference temperature sensed by the air temperature sensor 28 (i.e. the difference between the air temperature around the motor control system 10 and the temperature of the power module 25).

The procedure proceeds to Step S203, and the motor controller 26 compares the relative temperatures of the respective modules with thresholds. Specifically, it is determined whether the relative temperature of the diode module 24 is equal to or higher than a predetermined threshold (specifically, 20° C., for example). In addition, it is determined whether the relative temperature of the power module 25 is equal to or higher than a predetermined threshold (specifically, 30° C., for example).

When the relative temperature of the diode module 24 is equal to or higher than the predetermined threshold, the procedure proceeds to Step S204. At Step S204, the motor controller 26 calculates an amount of change in the remaining lifetime of the diode module 24 corresponding to the relative temperature of the diode module 24. Note that the motor controller 26 has stored therein in advance a calculation table that represents a relation between relative temperatures of the diode module 24 and amounts of change in the remaining lifetime of the diode module 24 in which the changes increase as the relative temperatures increase, and the motor controller 26 performs the calculation mentioned before by using the calculation table.

Thereafter the procedure proceeds to Step S205, and the motor controller 26 integrates amounts of change in the remaining lifetime of the diode module 24 having been observed thus far to thereby calculate the consumed lifetime of the diode module 24. Alternatively, an integrated value obtained by integration of amounts of change in the remaining lifetime of the diode module 24 having been observed thus far is subtracted from the preset lifetime of the diode module 24 to thereby calculate the remaining lifetime of the diode module 24. For example, supposing that the lifetime of a module is 100%, the remaining lifetime of the module becomes 99.5% in a case in which an amount of change in the remaining lifetime determined from a relative temperature and the calculation table is 0.5%. When the remaining lifetime is calculated next, an amount of change in the remaining lifetime is subtracted from 99.5%.

When the relative temperature of the power module 25 is equal to or higher than the predetermined threshold, the procedure proceeds to Step S204. At Step S204, the motor controller 26 calculates an amount of change in the remaining lifetime of the power module 25 corresponding to the relative temperature of the power module 25. Note that the motor controller 26 has stored therein in advance a calculation table that represents a relation between the relative temperatures of the power module 25 and amounts of change in the remaining lifetime of the power module 25 in which the changes increase as the relative temperatures increase, and the motor controller 26 performs the calculation mentioned before by using the calculation table.

Thereafter the procedure proceeds to Step S205, and the motor controller 26 integrates amounts of change in the remaining lifetime of the power module 25 having been observed thus far to thereby calculate the consumed lifetime of the power module 25. Alternatively, an integrated value obtained by integration of amounts of change in the remaining lifetime of the power module 25 having been observed thus far is subtracted from the preset lifetime of the power module 25 to thereby calculate the remaining lifetime of the power module 25.

Thereafter, the procedure proceeds to Step S206, and the motor controller 26 outputs, to the display apparatus 12 via the running controller 11, a command for updating the display of the consumed lifetime or remaining lifetime of each module. Accordingly, the display apparatus 12 updates the display of the consumed lifetime or remaining lifetime of each module.

At Step S207, the motor controller 26 determines whether there has been switching of the compressor body 3 from driving to stopping. When there has been switching of the compressor body 3 from driving to stopping, the motor controller 26 executes the following process.

At Step S202, at the time of switching of the motor 2 from driving to stopping, by using temperatures sensed by the temperature sensor 27 and the air temperature sensor 28 at the time of driving of the motor 2, and a relational expression about the temperature of the diode module 24 and the temperature of another component, the motor controller 26 calculates a relative temperature of the diode module 24 relative to a reference temperature sensed by the air temperature sensor 28. Similarly, at the time of switching of the motor 2 from driving to stopping, by using temperatures sensed by the temperature sensor 27 and the air temperature sensor 28 at the time of driving of the motor 2, and a relational expression about the temperature of the power module 25 and the temperature of another component, the motor controller 26 calculates a relative temperature of the power module 25 relative to the reference temperature sensed by the air temperature sensor 28.

Then, the procedure proceeds to Steps S203, S204, and S205, goes through the processes mentioned above, and the consumed lifetime or remaining lifetime of the diode module 24 is calculated. Similarly, the consumed lifetime or remaining lifetime of the power module 25 is calculated.

Thereafter, the procedure proceeds to Step S206, and the motor controller 26 outputs, to the display apparatus 12 via the running controller 11, a command for updating the display of the consumed lifetime or remaining lifetime of each module. Accordingly, the display apparatus 12 updates the display of the consumed lifetime or remaining lifetime of each module. Note that when the motor controller 26 receives, as input, information that a module has been replaced, the motor controller 26 initializes the consumed lifetime or remaining lifetime of the module.

In the manner mentioned above, in the present embodiment, the remaining lifetime of each module including a semiconductor element is monitored by calculating an amount of change in the remaining lifetime of the module corresponding to the relative temperature of the module at the time of switching of the compressor from no-load running to load running. In addition, the remaining lifetime of each module is monitored by calculating an amount of change in the remaining lifetime of the module corresponding to the relative temperature of the module at the time of switching of the compressor from driving to stopping. Accordingly, the processing load can be reduced as compared to a case where the remaining lifetime of each module is monitored by calculating an amount of change in the remaining lifetime of the module corresponding to a temperature change of the module always at the time of driving of the compressor.

A load variation of each module at the time of switching of the compressor from no-load running to load running is steeper than a load variation of the module at the time of switching of the compressor from stopping to driving. In addition, a load variation of each module at the time of switching of the compressor from driving to stopping is steeper than a load variation of the module at the time of switching of the compressor from load running to no-load running. In the present embodiment, a timing to calculate an amount of change in the remaining lifetime of each module is chosen, and it is possible thereby to enhance the precision of the remaining lifetime of the module.

Figure 5:
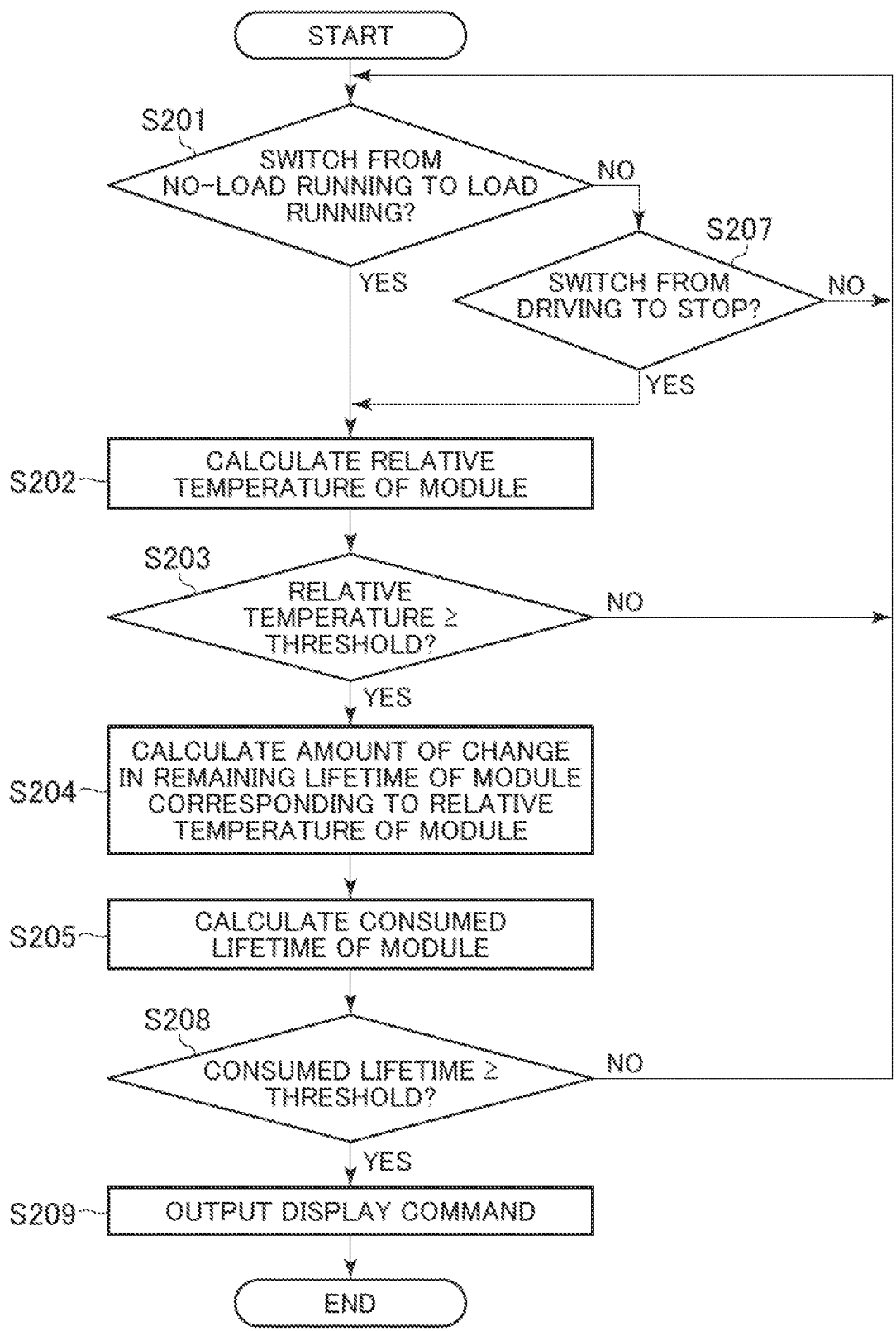
FIG. 5 is a flowchart representing a procedure of the module monitoring control according to one modification example to which the present invention is applied.

Note that whereas the display apparatus 12 displays the remaining lifetime or consumed lifetime of a module in the example explained in the one embodiment described above, this is not the sole example. For example, the display apparatus 12 may display information that the remaining lifetime or consumed lifetime of a module has reached a predetermined threshold, when the remaining lifetime or consumed lifetime has reached the predetermined threshold. Such a modification example is explained by using FIG. 5. FIG. 5 is a flowchart representing a procedure of the module monitoring control in the present modification example. Note that portions which are equivalent to their counterparts in the one embodiment described above are given identical reference characters, and explanations thereof are omitted as appropriate.

When the consumed lifetime or remaining lifetime of the diode module 24 is calculated at Step S205, the procedure proceeds to Step S208. At Step S208, the motor controller 26 determines whether the consumed lifetime or remaining lifetime of the diode module 24 has reached the predetermined threshold. When the consumed lifetime or remaining lifetime of the diode module 24 has reached the predetermined threshold, the procedure proceeds to Step S209. At Step S209, the motor controller 26 outputs, to the display apparatus 12 via the running controller 11, a command for displaying information that the consumed lifetime or remaining lifetime of the diode module 24 has reached the predetermined threshold. Accordingly, for example, the display apparatus 12 displays a message such as "replace diode module of motor control system."

When the consumed lifetime or remaining lifetime of the power module 25 is calculated at Step S205, the procedure proceeds to Step S208. At Step S208, the motor controller 26 determines whether the consumed lifetime or remaining lifetime of the power module 25 has reached the predetermined threshold. When the consumed lifetime or remaining lifetime of the power module 25 has reached the predetermined threshold, the procedure proceeds to Step S209. At Step S209, the motor controller 26 outputs, to the display apparatus 12 via the running controller 11, a command for displaying information that the consumed lifetime or remaining lifetime of the power module 25 has reached the predetermined threshold. Accordingly, for example, the display apparatus 12 displays a message such as "replace power module of motor control system."

In addition, whereas the motor controller 26 has the functionality of monitoring the remaining lifetime of each module (specifically, monitors the remaining lifetime of each module by calculating a relative temperature of the module relative to a reference temperature by using temperatures sensed by the temperature sensor 27 and the air temperature sensor 28, and calculating an amount of change in the remaining lifetime of the module corresponding to the relative temperature of the module) in the example explained in the one embodiment described above, this is not the sole example. Instead of the motor controller 26, the running controller 11 may have a functionality of monitoring the remaining lifetime of each module. Alternatively, the motor controller 26 and the running controller 11 may share the functionality of monitoring the remaining lifetime of each module. Specifically, the remaining lifetime of each module may be monitored by the motor controller 26 calculating a relative temperature of the module, and the running controller 11 calculating an amount of change in the remaining lifetime of the module corresponding to the relative temperature of the module. In these modification example also, advantages similar to those of the one embodiment described above can be attained.

Figure 6:
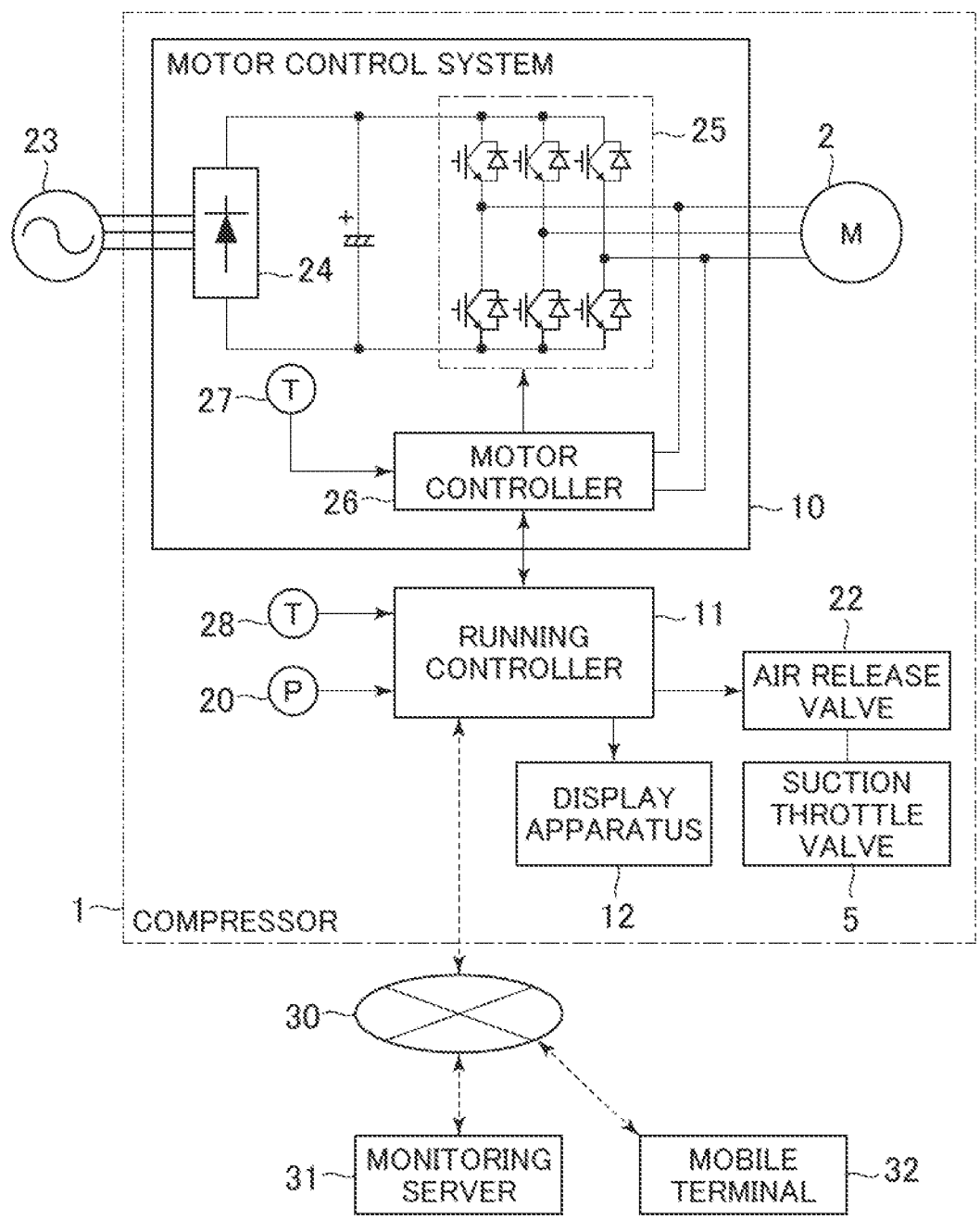
FIG. 6 is a schematic diagram representing the configuration of a monitoring system according to another embodiment to which the present invention is applied.

Another embodiment of the present invention is explained by using FIG. 6. Note that portions in the present embodiment which are equivalent to their counterparts in the one embodiment described above are given identical reference characters, and explanations thereof are omitted as appropriate.

FIG. 6 is a schematic diagram representing the configuration of a monitoring system in the present embodiment.

The monitoring system according to the present embodiment includes the compressor 1, a monitoring server 31 and a terminal 32 that can communicate with each other via a communication network 30 (specifically, for example, a wide-area network such as the Internet, or a small-area network such as a LAN). The monitoring server 31 has a calculation control section (e.g. a CPU) that executes calculation processes and control processes on the basis of a program, a storage section (e.g. a ROM, a RAM, or a hard disk) that stores the program and results of the calculation processes, and the like.

The compressor 1 has configuration similar to the one embodiment described above. It should be noted however that the motor controller 26 and the running controller 11 do not have the functionality of monitoring remaining lifetime of each module.

The monitoring server 31 receives the running condition of the compressor, and sensing results of the temperature sensor 27 and the air temperature sensor 28 via the communication network 30. In addition, similarly to the motor controller 26 in the one embodiment described above, the monitoring server 31 has a functionality of monitoring the remaining lifetime of each module. Then, when the remaining lifetime or consumed lifetime of a module is calculated, a command for updating the display is transmitted to at least one of the display apparatus 12 of the compressor 1 and the terminal 32 via the communication network 30. Accordingly, the display apparatus 12 or the terminal 32 updates the display of the remaining lifetime or consumed lifetime of the module.

Alternatively, similarly to the motor controller 26 in the one modification example described above, the monitoring server 31 has a functionality of monitoring the remaining lifetime of each module. Then, when the remaining lifetime or consumed lifetime of a module has reached a predetermined threshold, a command for displaying information that the remaining lifetime or consumed lifetime has reached the predetermined threshold is transmitted to at least one of the display apparatus 12 of the compressor 1 and the terminal 32 via the communication network 30. Accordingly, the display apparatus 12 or the terminal 32 displays the message.

In the thus-configured present embodiment also, it is possible to monitor the remaining lifetime of a module of the motor control system while the processing load is reduced.

Note that whereas at least one of the motor controller 26 and the running controller 11 or the monitoring server 31 calculates a relative temperature of a module relative to a reference temperature by using temperatures sensed by the temperature sensor 27 and the air temperature sensor 28 not only at the time of switching of the compressor from no-load running to load running, but at the time of switching of the compressor from driving to stopping in the examples explained in the embodiment and modification example described above, this is not the sole example. That is, a relative temperature of a module relative to a reference temperature may be calculated by using temperatures sensed by the temperature sensor 27 and the air temperature sensor 28 only at the time of switching of the compressor from no-load running to load running.

In addition, whereas at least one of the motor controller 26 and the running controller 11 or the monitoring server 31 calculates a relative temperature of a module relative to a reference temperature by using temperatures sensed by the temperature sensor 27 and the air temperature sensor 28 in the examples explained in the embodiment and modification example described above, this is not the sole example. A temperature sensed by the air temperature sensor 28 may not be used as the reference temperature, but a preset air temperature may be used.

In addition, whereas the motor control system 10 has the temperature sensor 27 that senses the temperature of another component other than the diode module 24 and the power module 25 as a representative temperature of the motor control system 10 in the examples explained in the embodiment and modification example described above, this is not the sole example. The motor control system 10 may have a plurality of temperature sensors that senses the temperature of the diode module 24 and the temperature of the power module 25, respectively.

In addition, whereas at least one of the motor controller 26 and the running controller 11 or the monitoring server 31 monitors both the remaining lifetime of the diode module 24 and the remaining lifetime of the power module 25 in the examples explained in the embodiment and modification example described above, this is not the sole example, and at least one of the motor controller 26 and the running controller 11 or the monitoring server 31 may monitor only one of the remaining lifetime of the diode module 24 and the remaining lifetime of the power module 25.

In addition, whereas the running controller 11 performs control of switching between high-speed running (first rotation speed) and low-speed running (second rotation speed) in the examples explained in the embodiment and modification example described above, this is not the sole example, and modifications are possible within the scope not deviating from the aim and technical idea of the present invention. That is, the running controller may perform control of consecutively changing the rotation speed according to the discharge pressure, and choose a certain appropriate rotation speed as the speed of high-speed running or low-speed running.

In addition, whereas the running controller 11 and the motor controller 26 are configured as separate bodies in the examples explained in the embodiment and modification example described above, this is not the sole example, and modifications are possible within the scope not deviating from the aim and technical idea of the present invention. That is, the running controller 11 and the motor controller 26 may be configured as a single body.

In addition, whereas the compressor 1 includes both the suction throttle valve 5 and the air release line 9 for performing switching between load running and no-load running of the compressor body 3 in the examples explained in the embodiment and modification example described above, this is not the sole example, and modifications are possible within the scope not deviating from the aim and technical idea of the present invention. That is, the compressor may include only one of the suction throttle valve 5 and the air release line 9.

In addition, whereas the compressor body 3 is an oil-supply type screw compressor that supplies oil into the compression chambers in the examples explained in the embodiment and modification example described above, this is not the sole example, and the compressor body 3 may be a water-supply type compressor body that supplies water into the compression chambers. Alternatively, the compressor body may be a non-liquid-supply type compressor body that does not supply a liquid such as oil or water into the compression chambers. That is, the compressor 1 does not have to include the separator 6 and the oil supply line 7. For example, the type of the compressor may be a scroll compressor, a turbo compressor, a reciprocating compressor or the like, and the present invention can be applied to any type of compressor as along as it is a compressor that performs switching between no-load running and load running according to a discharge pressure or a compressor that performs switching between driving/stopping of a motor according to a discharge pressure.

DESCRIPTION OF REFERENCE CHARACTERS

1: Compressor
2: Motor
3: Compressor body
10: Motor control system
11: Running controller
12: Display apparatus
20: Pressure sensor
23: Commercial power supply
24: Diode module
25: Power module
26: Motor controller
27: Temperature sensor
28: Air temperature sensor
30: Communication network
31: Monitoring server
32: Terminal

The invention claimed is:
1. A compressor comprising:
a motor;
a motor control system that controls a rotation speed of the motor;
a compressor body that compresses a gas by being driven by the motor;
a pressure sensor that is provided on a discharge side of the compressor body and senses a pressure of the compressed gas; and
a running controller that performs switching between load running and no-load running on a basis of the pressure sensed by the pressure sensor,
the motor control system having
a motor controller that controls power to be supplied to the motor via a circuit having a semiconductor element, and
a first temperature sensor that senses a temperature of the semiconductor element, wherein
at least one of the motor controller and the running controller is configured to:
calculate a relative temperature of the semiconductor element relative to a reference temperature by using the temperature sensed by the temperature sensor at time of switching from no-load running to load running; and calculate an amount of change in a remaining lifetime of the semiconductor element corresponding to the relative temperature of the semiconductor element, whereby the remaining lifetime of the semiconductor element is monitored.

2. The compressor according to claim 1, wherein at least one of the motor controller and the running controller is configured to:

calculate the relative temperature of the semiconductor element relative to the reference temperature by using the temperature sensed by the first temperature sensor at time of switching of the motor from driving to stopping; and calculate the amount of change in the remaining lifetime of the semiconductor element corresponding to the relative temperature of the semiconductor element, whereby the remaining lifetime of the semiconductor element is monitored.

3. The compressor according to claim 1, further comprising:

a second temperature sensor that senses an air temperature around the motor control system as the reference temperature, wherein at least one of the motor controller and the running controller is configured to calculate the relative temperature of the semiconductor element relative to the reference temperature by using the temperatures sensed by the first temperature sensor and the second temperature sensor.

4. The compressor according to claim 1, wherein at least one of the motor controller and the running controller is configured to output, to a display apparatus, a command for displaying information that the remaining lifetime or a consumed lifetime of the semiconductor element has reached a predetermined threshold, when the remaining lifetime or the consumed lifetime has reached the predetermined threshold.

5. The compressor according to claim 1, wherein the circuit having the semiconductor element is a diode circuit that converts an alternating current from a power supply into a direct current, and a power circuit that converts, into an alternating current, the direct current obtained through the conversion by the diode circuit, and that controls a frequency of the alternating current to be output to the motor.

6. A monitoring system comprising:

a compressor including a motor, a motor control system that controls a rotation speed of the motor, a compressor body that compresses a gas by being driven by the motor, a pressure sensor that is provided on a discharge side of the compressor body and senses a pressure of the compressed gas, and a running controller that performs switching between load running and no-load running on a basis of the pressure sensed by the pressure sensor, the motor control system having a motor controller that controls power to be supplied to the motor via a circuit that has a semiconductor element and having a first temperature sensor that senses a temperature of the semiconductor element; and a monitoring server that receives, from the compressor via a communication network, a running condition of the compressor, and a sensing result of the first temperature sensor, wherein the monitoring server is configured to:

calculate a relative temperature of the semiconductor element relative to a reference temperature by using the temperature sensed by the temperature sensor at time of switching of the compressor from no-load running to load running; and calculate an amount of change in a remaining lifetime of the semiconductor element corresponding to the relative temperature of the semiconductor element, whereby the remaining lifetime of the semiconductor element is monitored.

7. The monitoring system according to claim 6, wherein the monitoring server is configured to:

calculate the relative temperature of the semiconductor element relative to the reference temperature by using the temperature sensed by the first temperature sensor at time of switching of the motor from driving to stopping; and calculate the amount of change in the remaining lifetime of the semiconductor element corresponding to the relative temperature of the semiconductor element, whereby the remaining lifetime of the semiconductor element is monitored.

8. The monitoring system according to claim 6, wherein the compressor further includes a second temperature sensor that senses an air temperature around the motor control system as the reference temperature, and the monitoring server is configured to calculate the relative temperature of the semiconductor element relative to the reference temperature by using the temperatures sensed by the first temperature sensor and the second temperature sensor.

9. The monitoring system according to claim 6, wherein the monitoring server is configured to transmit, to at least one of a display apparatus of the compressor and a terminal via the communication network, a command for displaying information that the remaining lifetime or a consumed lifetime of the semiconductor element has reached a predetermined threshold, when the remaining lifetime or consumed lifetime has reached the predetermined threshold.

10. The monitoring system according to claim 6, wherein the circuit having the semiconductor element is a diode circuit that converts an alternating current from a power supply into a direct current, and a power circuit that converts, into an alternating current, the direct current obtained through the conversion by the diode circuit, and that controls a frequency of the alternating current to be output to the motor.

11. A method of monitoring a compressor including a motor, a compressor body that compresses a gas by being driven by the motor, a pressure sensor that is provided on a discharge side of the compressor body and senses a pressure of the compressed gas, at least one controller having a functionality of switching between load running and no-load running on a basis of the pressure sensed by the pressure sensor and a functionality of controlling power to be supplied to the motor via a circuit that has a semiconductor element, and a first temperature sensor that senses a temperature of the semiconductor element, the method comprising:

calculating a relative temperature of the semiconductor element relative to a reference temperature by using the temperature sensed by the first temperature sensor at time of switching of the compressor from no-load running to load running; and calculating an amount of change in a remaining lifetime of the semiconductor element corresponding to the relative temperature of the semiconductor element, whereby the remaining lifetime of the semiconductor element is monitored.

12. The method of monitoring the compressor according to claim 11, comprising:
calculating the relative temperature of the semiconductor element relative to the reference temperature by using the temperature sensed by the first temperature sensor at time of switching of the motor from driving to stopping; and
calculating the amount of change in the remaining lifetime of the semiconductor element corresponding to the relative temperature of the semiconductor element, whereby the remaining lifetime of the semiconductor element is monitored.

13. The method of monitoring the compressor according to claim 11, wherein
the compressor further includes a second temperature sensor that senses an air temperature around the circuit as the reference temperature, wherein
the relative temperature of the semiconductor element relative to the reference temperature is calculated by using the temperatures sensed by the first temperature sensor and the second temperature sensor.

14. The method of monitoring the compressor according to claim 11, wherein,
when the remaining lifetime or a consumed lifetime of the semiconductor element has reached a predetermined threshold, information that the remaining lifetime or the consumed lifetime has reached the predetermined threshold is displayed on at least one of a display apparatus of the compressor and a terminal.

15. The method of monitoring the compressor according to claim 11, wherein
the circuit having the semiconductor element is a diode circuit that converts an alternating current from a power supply into a direct current, and a power circuit that converts, into an alternating current, the direct current obtained through the conversion by the diode circuit, and that controls a frequency of the alternating current to be output to the motor.

* * * * *